(12) United States Patent
Sakaguchi et al.

(10) Patent No.: US 6,821,712 B2
(45) Date of Patent: *Nov. 23, 2004

(54) METHODS OF FORMING RESIST PATTERN, FORMING ELECTRODE PATTERN, AND MANUFACTURING SURFACE ACOUSTIC WAVE DEVICE

(75) Inventors: Kenji Sakaguchi, Kyoto-fu (JP); Toshiyuki Fuyutsume, Kyoto-fu (JP); Yoshihiro Koshido, Kyoto-fu (JP)

(73) Assignee: Murata Manufacturing Co., Ltd. (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 10/041,214

(22) Filed: Jan. 7, 2002

(65) Prior Publication Data

US 2002/0164545 A1 Nov. 7, 2002

(30) Foreign Application Priority Data

Jan. 12, 2001 (JP) ........................................ 2001-005642
Nov. 22, 2001 (JP) ........................................ 2001-358014

(51) Int. Cl.[7] ................................................. G03F 7/00
(52) U.S. Cl. ....................... 430/313; 430/311; 430/315; 430/319; 430/290; 430/950
(58) Field of Search ................................. 430/311, 313, 430/315, 319, 320, 290, 950

(56) References Cited

U.S. PATENT DOCUMENTS

| | | | | |
|---|---|---|---|---|
| 4,115,120 A | * | 9/1978 | Dyer et al. | 438/670 |
| 4,401,956 A | * | 8/1983 | Joshi | 333/152 |
| 6,159,621 A | * | 12/2000 | Schicht et al. | 428/633 |
| 6,399,222 B2 | * | 6/2002 | Arai et al. | 428/690 |
| 2002/0037599 A1 | * | 3/2002 | Ishida et al. | 438/29 |
| 2002/0164545 A1 | * | 11/2002 | Sakaguchi et al. | 430/314 |

FOREIGN PATENT DOCUMENTS

| | | | | |
|---|---|---|---|---|
| JP | 11-121371 | | 4/1999 | |
| JP | 2000-299617 | | 10/2000 | |
| JP | 2002-2217080 | * | 1/2001 | H01L/21/27 |
| JP | 2002-2280297 | * | 9/2002 | H01L/21/27 |

OTHER PUBLICATIONS

Japanese Examination Report mailed Jul. 15, 2003 (w/ English translation of relevant portion).
Japanese Examination Report mailed Mar. 25, 2003 (w/English translation of relevant portion).

* cited by examiner

*Primary Examiner*—Mark F. Huff
*Assistant Examiner*—Nicole Barreca
(74) *Attorney, Agent, or Firm*—Dickstein, Shapiro, Morin & Oshinsky, LLP.

(57) ABSTRACT

Methods of forming a resist pattern, of forming an electrode pattern, and of manufacturing a surface acoustic wave device are provided. The resist-pattern- and the electrode-pattern-forming methods each comprise a step of forming an antireflection film for preventing ultraviolet light from diffusely reflecting to a transparent substrate. The antireflection film is formed with a semiconductor having a band gap energy of 3.4 eV or less. The reflectance is expressed by $(n_1-n_2)^2/(n_1+n_2)^2$ is 0.15 or less, wherein $n_1$ and $n_2$ is the refractive indexes of the substrate and the antireflection film, respectively. The resist-pattern- and the electrode-pattern-forming methods with simple processes can achieve high-quality, reliable resist patterns and electrode patterns.

19 Claims, 5 Drawing Sheets

METHODS OF FORMING RESIST PATTERN, FORMING ELECTRODE PATTERN, AND MANUFACTURING SURFACE ACOUSTIC WAVE DEVICE

BACKGROUND OF THE INVENTION

1. Field of the Invention

The present invention relates to methods of forming a resist pattern with a photoresist on a substrate, of forming a metal electrode pattern, and of manufacturing a surface acoustic wave device.

2. Description of the Related Art

The following method is known as a method of forming a metallic resist pattern. FIGS. 1A to 1C show a known method of forming a resist pattern.

In this method, a substrate 1 is coated with a positive or negative photoresist 3 (FIG. 1A), and the photoresist 3 is exposed to an ultraviolet light with a wavelength of 365 nm or less through a photomask 10 provided with holes to form a desired pattern (FIG. 1B). Then, a resist pattern 4 is formed by developing the photoresist 3 so as to partly expose the substrate 1 (FIG. 1C).

However, when the substrate is formed from a transparent material such as $LiTaO_3$, the resist-pattern-forming areas of the photoresist, which are normally not exposed to the light because of the protection by the photomask, are exposed to diffusely reflected light caused by the transparent substrate. Then, part of the resist pattern which is normally not developed is developed and removed, and consequently, the desired resist pattern cannot be formed. Furthermore, when a finer resist pattern having a reduced width is formed, part thereof may be removed, and at worst pattern deformation may occur.

In order to solve this problem, an antireflection film formed of an organic polymer containing a colorant capable of absorbing ultraviolet light with a wavelength of about 365 nm has been provided at the back of the substrate to prevent the diffusely reflected light. Alternatively, an antireflection film formed by laminating a silicon layer and a lightproof metallic layer in that order has been provided at the back of the substrate.

These antireflection films, however, have caused the following problems. First, using the organic polymer for an antireflection film causes contamination of the stage of the stepper, thereby making accurate light exposure difficult. In other words, the accumulated residue of the organic polymer causes a degraded flatness of the stage, thereby deteriorating the accuracy of light exposure.

Second, the photoresist is cured at about 100° C., whereas the organic-polymer antireflection film is cured at a high baking temperature of about 200° C. As a result, if the transparent substrate is pyroelectric, it is likely to be damaged by electrostatic charge. In order to solve this problem, an additional conductive film may be provided on the surface of the organic-polymer antireflection film to discharge the static electricity caused by the temperature variation. Unfortunately, providing the conductive film on the surface of the antireflection film increases the number of the processes, inevitably increasing the cost.

Third, when the antireflection film formed by laminating a silicon layer and a lightproof metallic layer in that order is used, the favorable range of the film thickness is limited, and an additional process, which increases the cost, is required to form the lightproof metallic layer. In addition, since the refractive index of silicon for ultraviolet rays is 0.57 to 0.77, the silicon layer cannot adequately inhibit the reflection of ultraviolet rays when the material of the substrate has a refractive index of 1.5 or more.

SUMMARY OF THE INVENTION

Accordingly, it is an object of the present invention to provide a method of forming a resist pattern in which an antireflection film capable of preventing the diffuse reflection caused by the transparent substrate is formed.

To this end, according to one aspect of the present invention, there is provided a method of forming a resist pattern. The method comprises the steps of forming a substrate with a material having a refractive index $n_1$ and forming an antireflection film on the rear surface of the substrate with a semiconductor having a band gap energy of 3.4 eV or less and a refractive index $n_2$. In this instance, the reflectance expressed by $(n_1-n_2)^2/(n_1+n_2)^2$ is 0.15 or less. The method comprises the steps of coating the substrate with a photoresist and radiating an ultraviolet light on the photoresist downward through a photomask so that the photoresist becomes partly soluble in a developer. Also, the method comprises a step of soaking the substrate in the developer to remove the soluble photoresist.

The substrate may be formed of $LiTaO_3$ and the antireflection film may be formed of a material having a refractive index $n_1$ in the range of 1.2 to 4.6.

Alternatively, the substrate may be formed of $LiNbO_3$ and the antireflection film may be formed of a material having a refractive index $n_1$ in the range of 1.0 to 4.0.

The antireflection film may be formed of a material selected from the group consisting of ZnO, ZnSe, ZnTe, CdSe, CdS, CdTe, and TiOx ($0<x\leq2$).

The method may further comprise a step of mirror-finishing the rear surface of the substrate.

The mirror-finished surface of the substrate may have a roughness of 50 nm or less.

The antireflection film may be formed of ZnO or ZnO containing a metal.

The metal may be Ni.

The developer may be alkaline.

The antireflection film may have a thickness in the range of 0.05 to 2 μm.

The resist-pattern-forming method includes forming the inorganic semiconductive antireflection film of ZnO, ZnSe, ZnTe, CdSe, CdS, CdTe, TiOx ($0<x\leq2$), or the like on the rear of the substrate, having a band gap energy of 3.4 eV or less, such that the reflectance expressed by $(n_1-n_2)^2/(n_1+n_2)^2$ is 0.15 or less, wherein $n_1$ and $n_2$ are the refractive indexes of the substrate and the antireflection film, respectively. This method does not cause contamination of the stage of the stepper nor does it require any additional antireflection layers. By applying this method, the diffuse reflection of ultraviolet light and pattern deformation are prevented so that reliable fine resist patterns can be manufactured.

According to another aspect of the present invention, a method of forming an electrode pattern is provided. The method comprises the steps of forming a resist pattern by the resist-pattern-forming method of the present invention and forming a metal film on the partly exposed surface of the substrate and the resist pattern. Also, a step of removing the resist pattern together with the metal film formed thereon is provided.

The electrode-pattern-forming method does not lead to a partly removed resist pattern by the developer nor does it cause pattern deformation even when the resist pattern is finely formed to have thin line widths. The method therefore achieves reliable fine electrode patterns.

According to another aspect of the present invention, a method of manufacturing a surface acoustic wave device is provided. The method comprises the above method of forming a resist pattern or the above method of forming an electrode pattern. The methods of forming a resist pattern and an electrode pattern lead to fine resist patterns without problems such as pattern deformation, and the surface acoustic wave device manufactured by either of the methods can have a reliable fine IDT (interdigital transducer). In particular, the methods contribute to an improvement in the performance of the surface acoustic wave device requiring a very fine pattern for the use in the frequency band of 1 GHz or more and to increasing the process yield.

Other features and advantages of the present invention will become apparent from the following description of the invention which refers to the accompanying drawings.

BRIEF DESCRIPTION OF THE DRAWING(S)

DETAILED DESCRIPTION OF EMBODIMENTS OF THE INVENTION

A first embodiment of the present invention will now be described with reference to FIGS. 2A to 2C.

Figure 1A:
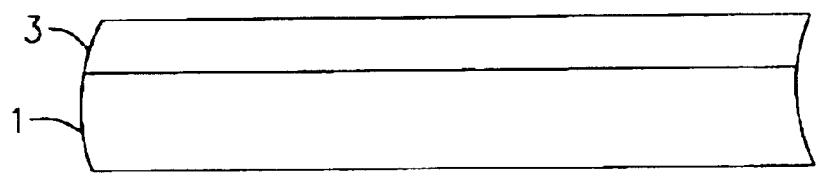
FIGS. 1A to 1C are drawings showing a method of forming a known resist pattern.
Figure 1B:
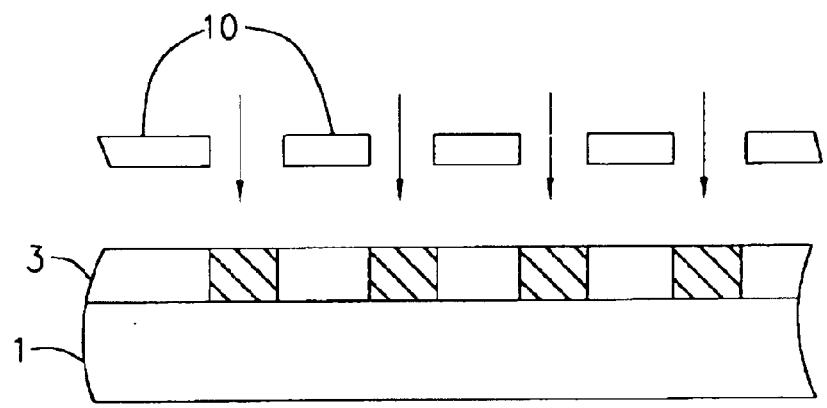
Figure 1C:
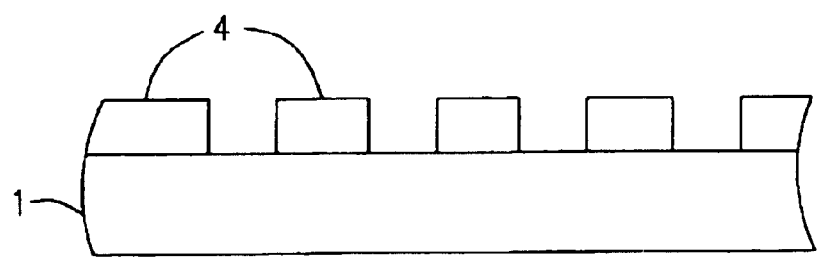
Figure 2A:
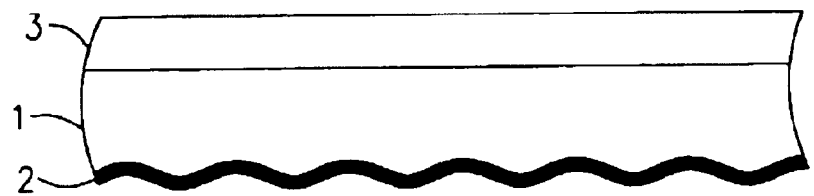
FIGS. 2A to 2C are drawings showing a method of forming a resist pattern of the present invention.
Figure 2B:
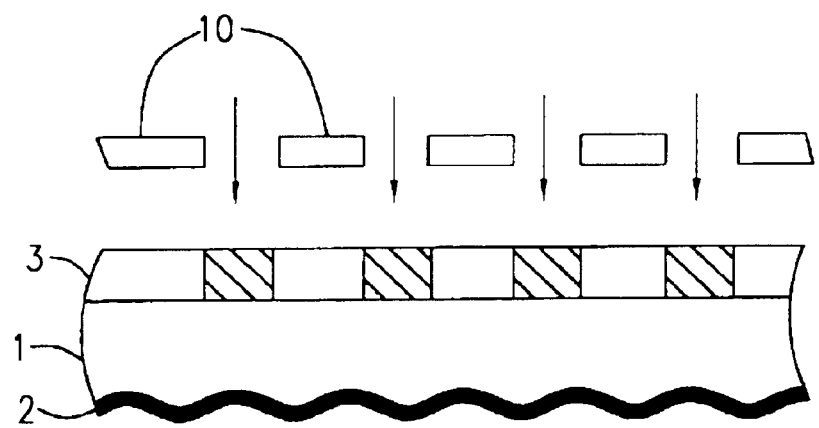
Figure 2C:
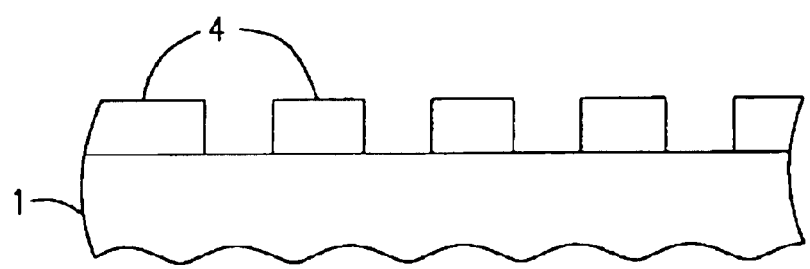

FIGS. 2A to 2C show a method of forming a resist pattern according to the first embodiment.

As shown in FIG. 2A, an antireflection film 2 with a thickness of 0.5 µm is formed of ZnO on the rear surface of a transparent substrate 1 with a thickness of 0.1 to 0.5 nm formed of, for example, $LiTaO_3$ by ion plating or sputtering. Then, a photoresist 3 serving as a positive resist is applied on the substrate 1 and is heated at 100° C. to be cured.

Next, as shown in FIG. 2B, ultraviolet light having a wavelength of 365 nm is radiated downward on the surface of the substrate 1 through a photomask 10 provided with holes having desired shapes, so that the photoresist 3 becomes partly soluble in alkaline developers. Preferably, the photoresist 3 is as sensitive as possible.

Next, as shown in FIG. 2C, the photoresist 3 is developed with an alkaline developer so that the exposed areas of the photoresist 3 are removed to form a resist pattern 4. Concurrently, the alkaline developer dissolves the antireflection film 2 formed of ZnO, which is soluble in alkaline.

The ultraviolet light with a wavelength of 365 nm has an energy of about 3.4 eV. Generally, when a semiconductor has a lower band gap energy, it readily absorbs the energy of the light radiated thereto. Since the band gap energy of ZnO used as the antireflection film 2 is about 3.2 eV, the antireflection film 2 can adequately absorb the ultraviolet light to prevent the light from reflecting diffusely to undesired areas when the light reaches the antireflection film 2 on the rear surface of the substrate 1. In addition, the difference between the refractive indexes of $LiTaO_3$ used for the substrate 1 and ZnO used for the antireflection film 2 inhibits the reflection of the ultraviolet light.

Figure 3:
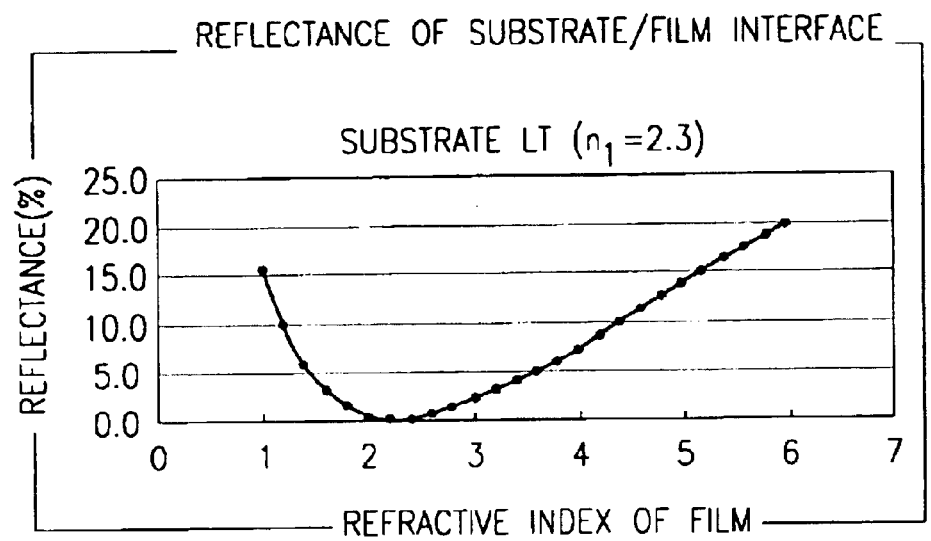
FIG. 3 is a graph showing the reflectance at the interface between a substrate and an antireflection film when the substrate is formed of $LiTaO_3$ having a refractive index of 2.3 and the refractive index of the antireflection film is varied.

Specifically, the reflectance r is expressed by the equation: $r=(n_1-n_2)^2/(n_1+n_2)^2$, wherein $n_1$ is the refractive index of the substrate material and $n_2$ is the refractive index of the antireflection film material. FIG. 3 shows the reflectance at the interface between the substrate 1 and the antireflection film 2 when the substrate is formed of $LiTaO_3$ having a refractive index of 2.3 and the refractive index of the antireflection film 2 is varied.

FIG. 3 shows that, as the refractive index of the antireflection film 2 approaches the refractive index of 2.3 of $LiTaO_3$, the reflectance r is minimized. An between the substrate 1 and the antireflection film 2 having a reflectance of 15.0% or less can limit the reflection of the ultraviolet light to a practicable degree. Preferably, the reflectance at the interface is 10.0% or less, and accordingly the refractive index of the antireflection film is required to be in the range of 1.2 to 4.6. Preferably, a material selected from the group consisting of ZnO, ZnSe, ZnTe, CdSe, CdS, CdTe, and $TiO_x$ ($0<x\leq2$) is used for the antireflection film 2. In the first embodiment, using ZnO having a refractive index of 3 for the antireflection film results in a very low reflectance of 1.7% at the interface between the substrate and the antireflection film.

Figure 4:
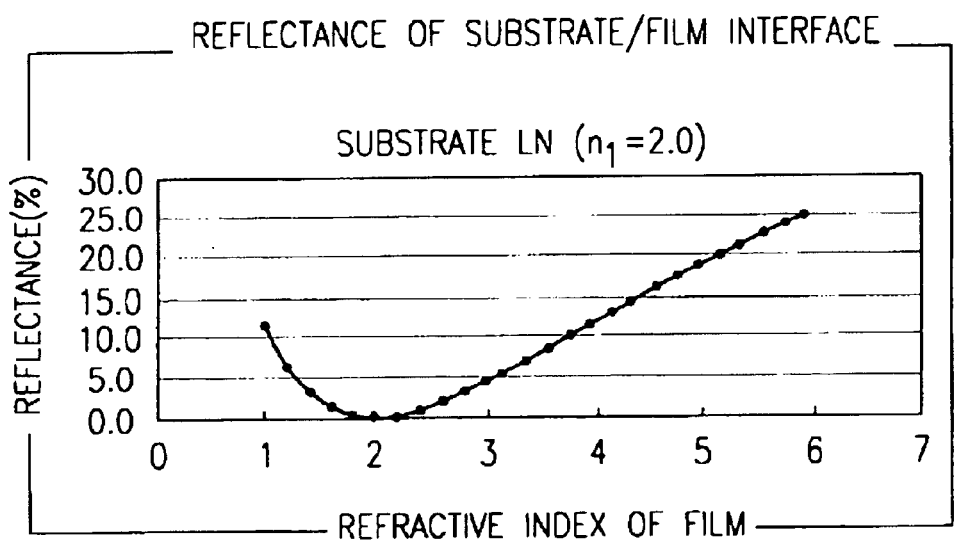
FIG. 4 is a graph showing the reflectance at the interface between a substrate and an antireflection film when the substrate is formed of $LiNbO_3$ having a refractive index of 2.3 and the refractive index of the antireflection film is varied.

This relationship between the refractive index of an antireflection film and the reflectance at the interface can be applied to materials for the substrate other than $LiTaO_3$. For example, FIG. 4 shows that when $LiNbO_3$ is used for the substrate 1, the reflectance is minimized as the refractive index of the antireflection film 2 approaches the refractive index of 2.0 of the $LiNbO_3$. Thus, a material capable of limiting the reflectance at the interface to 15.0% or less is used for the antireflection film 2, as in the case of $LiTaO_3$. Preferably, the reflectance at the interface is 10.0% or less, and accordingly the refractive index of the antireflection film is required to be in the range of 1.0 to 4.0. Preferably, a material selected from the group consisting of ZnO, ZnSe, ZnTe, CdSe, CdS, CdTe, and $TiO_x$ ($0<x\leq2$) is used for the antireflection film 2, as in the case in which $LiTaO_3$ is used for the substrate 1.

In the series of processes of forming the resist pattern, inorganic ZnO does not contaminate the stage of the stepper, and consequently, the flatness of the stage is not degraded to adversely affect the light exposure. Furthermore, since the baking temperature of ZnO is lower than that of organic materials, electrostatic charge is low enough not to cause any problems even if a pyroelectric material is used for the substrate. While the transparent substrate 1 is generally formed of an insulating material, semiconductive ZnO used for the antireflection film 2 has an electrical conductivity higher than that of the substrate 1, thereby efficiently discharging the static electricity generated in the process of baking the resist. Therefore, no conductive film needs to be provided.

In the first embodiment, the antireflection film 2 is formed of ZnO. Alternatively, ZnO containing 2% of Ni may be used. Adding a small amount of Ni to ZnO lowers the band gap energy and improves the absorption efficiency for ultraviolet light. In this instance, the electrical resistance of the antireflection film 2 is also lowered, and therefore the static electricity generated in the process of baking the resist is more efficiently discharged.

The preferable thickness of the antireflection film 2 will now be described. An antireflection film 2 having an excessively small thickness does not sufficiently prevent reflection. The thickness of the antireflection film 2 is required to be at least 0.05 mm. On the other hand, a thick film with a thickness of about 2 μm increases the film stress, thereby making it likely that breaks in the substrate occur although a thickness of 3 μm or more does not improve the antireflection effect. Accordingly, a thickness of about 0.5 μm is preferable as this does not have to be delicately adjusted and can sufficiently prevent the reflection.

Figure 5A:
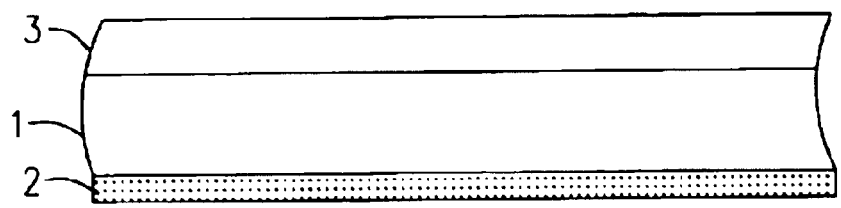
FIGS. 5A to 5C are drawings showing a method of forming a resist pattern of the present invention.
Figure 5B:
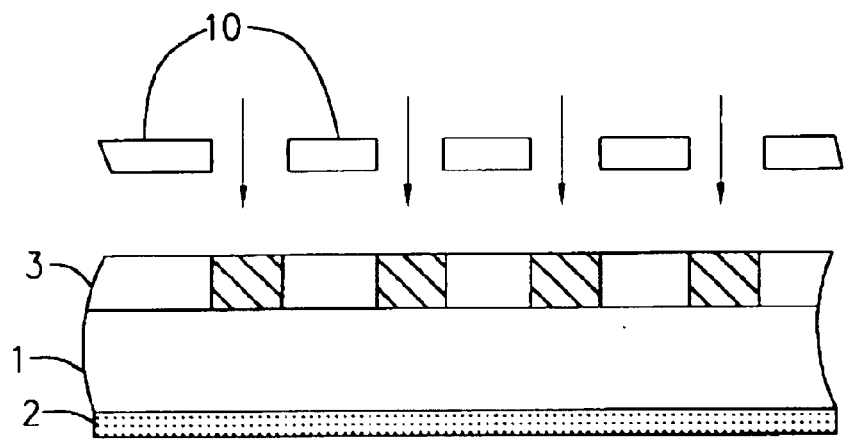
Figure 5C:
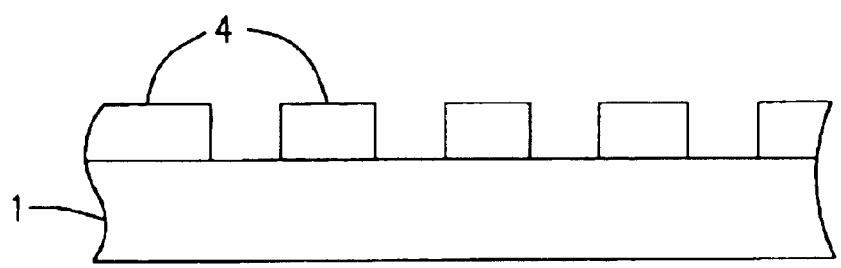

Turning to FIGS. 5A to 5C, a second embodiment of the present invention will now be described.

FIGS. 5A to 5C show a method of forming a resist pattern according to the second embodiment.

The resist pattern of the second embodiment is formed in the same manner as the first embodiment except that the rear of the substrate 1 is processed to have a mirror-finished surface.

The mirror-finished rear of the substrate 1 does not result in areas where the antireflection film is not formed. Such areas often appear in the most recessed areas in the rough rear surface of the substrate. Thus, the invention completely prevents the exposure light from reflecting from the rear surface. As a result, the mirror-finished rear surface leads to a precise resist pattern, and specifically, the rear surface with a roughness Ra of 50 nm leads to a sufficiently precise resist pattern.

Wafer substrates are generally used in manufacturing processes of, for example, surface acoustic wave devices. The local thickness variation (LTV) of a wafer substrate depends on the roughness of the rear surface thereof and a larger roughness results in a larger LTV. A substrate having a large LTV causes the displacement of the focus within the range of stepper exposure, thereby degrading the processing accuracy in the line widths of the resist pattern. Accordingly, by using a mirror-finished wafer substrate having a low LTV, of which the roughness Ra of the rear surface is 50 nm or less, the difference of the line widths of the resist is lowered, thereby achieving a resolution on the order of a quarter micron.

A method of manufacturing an electrode pattern of the present invention will now be described with reference to FIGS. 2C, 6A, and 6B.

Figure 6A:
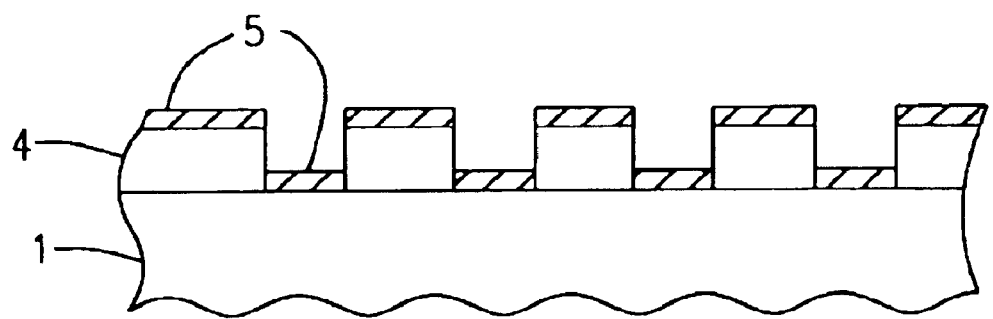
FIGS. 6A to 6B are drawings showing a method of forming an electrode pattern of the present invention.
Figure 6B:
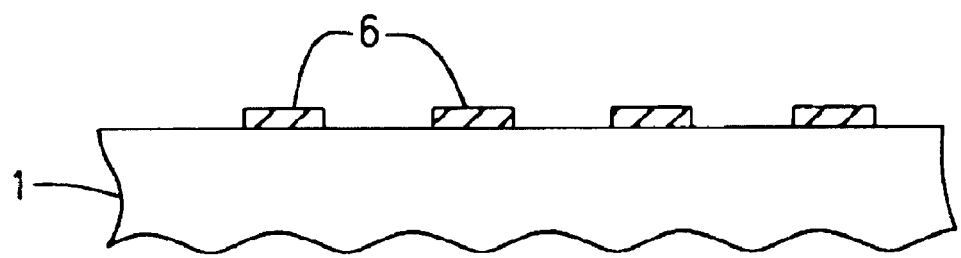

FIGS. 6A and 6B show a method of manufacturing an electrode pattern.

First, the resist pattern 4 shown in FIG. 2C is formed on the substrate 1 by the method of forming the resist pattern.

Next, as shown in FIG. 6A, a metal film 5 which is to result in an electrode pattern 6 is formed on the exposed surfaces of the substrate 1 and the resist pattern 4.

Then, in order to form the electrode pattern 6, the substrate 1 is soaked in a resist-removing solution to remove the resist pattern 4 together with the metal deposited on the resist pattern 4.

By using ZnO containing 2% of Ni for the antireflection film in the present invention, the electrode pattern 6 with a very thin width of 0.25 μm was achieved.

While the substrate has been formed of LiTaO$_3$ in the present invention, it is not limited to this material and LiNbO$_3$ or quartz may be used for the transparent substrate. Also, the photoresist is not limited to a positive resist and may be negative or positive.

The methods of forming the resist pattern and the electrode pattern lead to a fine resist pattern without problems such as pattern deformation, and the surface acoustic wave device manufactured by either of the methods can have a reliable fine interdigital transducer (IDT). Furthermore, the methods contribute to improving the performance of the surface acoustic wave device requiring a very fine pattern for use in the frequency band of 1 GHz or more. Since bulk waves are not generated in the band through which the surface acoustic wave of the device used in the frequency band of 1 GHz or more passes, the rear of the substrate does not necessarily require a rough surface to inhibit the generation of the bulk waves. Hence, forming the substrate with a mirror-finished rear surface can be applied to the method of forming the resist pattern or the electrode pattern, thereby achieving very fine precise patterns. Thus, an improved performance of the surface acoustic wave device and an increased process yield can be achieved.

According to the present invention, the resist-pattern-forming method includes forming the inorganic semiconductive antireflection film of ZnO, ZnSe, ZnTe, CdSe, CdS, CdTe, TiOx (0<x≦2), or the like on the rear of the substrate, having a band gap energy of 3.4 eV or less, such that the reflectance expressed by $(n_1-n_2)^2/(n_1+n_2)^2$ is 0.15 or less, wherein $n_1$ and $n_2$ are the refractive indexes of the substrate and the antireflection film, respectively. This method does not cause contamination of the stage of the stepper nor does it require any additional antireflection layers. By applying this method, the diffuse reflection of ultraviolet light and pattern deformation are prevented so that reliable fine resist patterns can be manufactured.

The electrode-pattern-forming method does not lead to a partly removed resist pattern by the developer nor does it cause pattern deformation even when the resist pattern is finely formed to have thin line widths. The method therefore achieves reliable fine electrode patterns.

The methods of forming the resist pattern and the electrode pattern lead to fine resist patterns without problems such as pattern deformation, and the surface acoustic wave device manufactured by either of the methods can have a reliable fine IDT. In particular, the methods contribute to an improvement in the performance of the surface acoustic wave device requiring a very fine pattern for use in the frequency band of 1 GHz or more and to increasing the process yield.

Although the present invention has been described in relation to particular embodiments thereof, many other variations and modifications and other uses will become apparent to those skilled in the art. Therefore, the present invention should be limited not by the specific disclosure herein, but only by the appended claims.

What is claimed is:

1. A method of forming a resist pattern, the method comprising:
   providing a substrate;
   providing an antireflection film on a rear surface of the substrate comprising a semiconductor having a band gap energy of 3.4 eV or less;
   coating the substrate with a photoresist;
   radiating ultraviolet light on the photoresist through a photomask so that at least a portion of the photoresist becomes partly soluble in a developer; and
   soaking the substrate in the developer to remove the soluble photoresist.

2. The method of forming a resist pattern according to claim 1, wherein the antireflection film comprises a material selected from the group consisting of ZnO, ZnSe, ZnTe, CdSe, CdS, CdTe, and TiOx (0<x≦2).

3. The method of forming a resist pattern according to claim 1, further comprising a step of mirror-finishing the rear surface of the substrate.

4. The method of forming a resist pattern according to claim 3, wherein the mirror-finished surface of the substrate has a roughness of 50 nm or less.

5. The method of forming a resist pattern according to claim 1, wherein the antireflection film is formed of ZnO or ZnO containing a metal.

6. The method of forming a resist pattern according to claim 7, wherein the metal contained in ZnO is Ni.

7. The method of forming a resist pattern according to claim 1, wherein the developer is alkaline.

8. The method of forming a resist pattern according to claim 1, wherein the antireflection film has a thickness in the range of 0.05 to 2 μm.

9. The method of forming a resist pattern according to claim 1, wherein the substrate has a refractive index n1, the antireflection film has a refractive index n2, and a reflectance expressed by $(n1-n2)^2/(n1+n2)^2$ is 0.15 or less.

10. The method of forming a resist pattern according to claim 9, wherein the substrate comprises $LiTaO_3$ and the antireflection film comprises a material having a refractive index n2 in the range of 1.2 to 4.6.

11. The method of forming a resist pattern according to claim 9, wherein the substrate comprises $LiNbO_3$ and the antireflection film comprises a material having a refractive index n2 in the range of 1.0 to 4.0.

12. The method of forming a resist pattern according to claim 1, wherein the substrate comprises $LiTaO_3$.

13. The method of forming a resist pattern according to claim 1, wherein the substrate comprises $LiNbO_3$.

14. A method of forming an electrode pattern comprising:
   forming a resist pattern, the resist pattern being formed by:
   providing a substrate;
   providing an antireflection film on a rear surface of the substrate comprising a semiconductor having a band gap energy of 3.4 eV or less;
   coating the substrate with a photoresist;
   radiating ultraviolet light on the photoresist through a photomask so that at least a portion of the photoresist becomes partly soluble in a developer; and
   soaking the substrate in the developer to remove the soluble photoresist thereby providing a partially exposed surface of the substrate and the resist pattern; further comprising:
   providing a metal film on the partially exposed surface of the substrate and on the resist pattern; and
   removing the resist pattern together with the metal film formed on the resist pattern.

15. The method of forming an electrode pattern comprising according to claim 14, wherein the substrate has a refractive index n1, the antireflection film has a refractive index n2, and a reflectance expressed by $(n1-n2)^2/(n1+n2)^2$ is 0.15 or less.

16. A method of manufacturing a surface acoustic wave device, the method comprising:
   forming a resist pattern, the resist pattern being formed by:
   providing a substrate;
   providing an antireflection film on a rear surface of the substrate comprising a semiconductor having a band gap energy of 3.4 eV or less;
   coating the substrate with a photoresist;
   radiating ultraviolet light on the photoresist through a photomask so that at least a portion of the photoresist becomes partly soluble in a developer; and
   soaking the substrate in the developer to remove the soluble photoresist.

17. A method of manufacturing a surface acoustic wave device according to claim 16, wherein the substrate has a refractive index n1, the antireflection film has a refractive index n2, and a reflectance expressed by $(n1-n2)^2/(n1+n2)^2$ is 0.15 or less.

18. A method of manufacturing a surface acoustic wave device, the method comprising:
   forming an electrode pattern, the electrode pattern formed by forming a resist pattern by:
   providing a substrate;
   providing an antireflection film on a rear surface of the substrate comprising a semiconductor having a band gap energy of 3.4 eV or less;
   coating the substrate with a photoresist;
   radiating ultraviolet light on the photoresist through a photomask so that at least a portion of the photoresist becomes partly soluble in a developer; and
   soaking the substrate in the developer to remove the soluble photoresist thereby providing a partially exposed surface of the substrate and the resist pattern; and further comprising:
   providing a metal film on the partially exposed surface of the substrate and on the resist pattern; and
   removing the resist pattern together with the metal film formed thereon.

19. A method of manufacturing a surface acoustic wave device according to claim 18, wherein the substrate has a refractive index n1, the antireflection film has a refractive index n2, and a reflectance expressed by $(n1-n2)^2/(n1+n2)^2$ is 0.15 or less.

* * * * *